(12) United States Patent
Li et al.

(10) Patent No.: US 12,153,102 B2
(45) Date of Patent: Nov. 26, 2024

(54) MICRO-FLUXGATE SENSOR

(71) Applicant: NINGBO CRRC TIMES TRANSDUCER TECHNOLOGY CO., LTD., Ningbo (CN)

(72) Inventors: Juping Li, Ningbo (CN); Liangguang Zheng, Ningbo (CN); Xiaowei Hou, Ningbo (CN); Tao Jiang, Ningbo (CN); Junjie Guo, Ningbo (CN); Zhujian Chen, Ningbo (CN); Po Zhang, Ningbo (CN); Fangliang Zhu, Ningbo (CN); Hang Zhao, Ningbo (CN)

(73) Assignee: NINGBO CRRC TIMES TRANSDUCER TECHNOLOGY CO., LTD., Ningbo (CN)

( * ) Notice: Subject to any disclaimer, the term of this patent is extended or adjusted under 35 U.S.C. 154(b) by 495 days.

(21) Appl. No.: 17/594,927

(22) PCT Filed: Nov. 19, 2019

(86) PCT No.: PCT/CN2019/119336
§ 371 (c)(1),
(2) Date: Nov. 3, 2021

(87) PCT Pub. No.: WO2020/258688
PCT Pub. Date: Dec. 30, 2020

(65) Prior Publication Data
US 2022/0260652 A1 Aug. 18, 2022

(30) Foreign Application Priority Data

Jun. 25, 2019 (CN) .......................... 201910555343.7

(51) Int. Cl.
*G01R 33/06* (2006.01)
*G01R 33/00* (2006.01)

(52) U.S. Cl.
CPC ....... *G01R 33/066* (2013.01); *G01R 33/0023* (2013.01)

(58) Field of Classification Search
None
See application file for complete search history.

(56) References Cited

U.S. PATENT DOCUMENTS

| 4,293,815 A | 10/1981 | West et al. | |
|---|---|---|---|
| 2005/0072011 A1* | 4/2005 | Miyashita | G01C 17/30 33/355 R |

FOREIGN PATENT DOCUMENTS

| CN | 1495435 A | 5/2004 |
|---|---|---|
| CN | 101672301 A | 3/2010 |

(Continued)

OTHER PUBLICATIONS

International Search Report dated Mar. 24, 2020 from PCT Application No. PCT/CN2019/119336.

*Primary Examiner* — Jas A Sanghera
(74) *Attorney, Agent, or Firm* — INNOVATION CAPITAL LAW GROUP, LLP; Vic Lin

(57) ABSTRACT

A micro-fluxgate sensor has a double-iron core assembly, a self-oscillating module, a current superimposing and amplifying module and a voltage acquisition module. The double-iron core assembly comprises a first iron core and a second iron core. The first iron core is provided with a first winding coil. The second iron core is provided with a second winding coil. The first winding coil and the second winding coil are respectively connected with an input end of the self-oscillating module, and an output end of the self-oscillating module is respectively connected with the current superimposing and amplifying module and the voltage acquisition module. The fluxgate sensor is simple in processing circuit without manual debugging and is easily integrated.

8 Claims, 3 Drawing Sheets

(56) References Cited

FOREIGN PATENT DOCUMENTS

| | | |
|---|---|---|
| CN | 101672901 A | 3/2010 |
| CN | 203672938 U | 6/2014 |
| CN | 204347174 U | 5/2015 |
| CN | 204631233 U | 9/2015 |
| CN | 105044629 A | 11/2015 |
| CN | 106645863 A | 5/2017 |
| CN | 107102187 A | 8/2017 |
| CN | 207380115 U | 5/2018 |
| CN | 208156069 U | 11/2018 |
| CN | 110146832 A | 8/2019 |

* cited by examiner

MICRO-FLUXGATE SENSOR

TECHNICAL FIELD

The invention relates to the technical field of magnetic field detection sensors, in particular to a micro fluxgate sensor.

BACKGROUND OF THE INVENTION

The micro-fluxgate sensor primarily includes two portions: a fluxgate probe and a fluxgate processing circuit.

A common fluxgate probe is primarily prepared by winding a three-dimensional solenoid coil on a strip-shaped magnetic core. Although the method is relatively simple in manufacturing process, the fluxgate probe is large in volume size, high in volume production cost, larger in assembly error and relatively poor in matching degree of the iron core and the winding, is easily affected by temperature, stress and mechanical vibration, is larger in output error, and needs to be calibrated frequently in a later period.

Meanwhile, the processing circuits of the fluxgate sensor are relatively complex. Some of the processing circuits adopt a harmonic selective method to process signals, including a frequency selecting amplification circuit, a phase-sensitive rectification circuit, an integral circuit and the like. Some of the processing circuits adopt a filter circuit and an integral circuit and the like to perform negative feedback processing. These circuit processing methods have a common problem that the circuit is quite complex, large in occupied space and extremely difficult to miniaturize.

BRIEF SUMMARY OF THE INVENTION

In order to solve the problem of the existing fluxgate sensor, the invention aims to provide a micro-fluxgate sensor, herein a signal processing circuit is simplified effectively while the size of the fluxgate probe can be reduced greatly.

In order to achieve the objective, a technical scheme adopted by the invention is as follows: provided is a micro-fluxgate sensor, the micro-fluxgate sensor including a double-iron core assembly, a self-oscillating module, a current superimposing and amplifying module and a voltage acquisition module,
wherein the double-iron core assembly includes a first iron core and a second iron core, the first iron core is provided with a first winding coil, and the second iron core is provided with a second winding coil; the first winding coil and the second winding coil are respectively connected with an input end of the self-oscillating module, and an output end of the self-oscillating module is respectively connected with the current superimposing and amplifying module and the voltage acquisition module; and the current superimposing and amplifying module is connected with the voltage acquisition module.

Field directions generated by a measured magnetic field in the first iron core and the second iron core are the same, and exciting field directions generated by the first winding coil and the second winding coil in the first iron core and the second iron core are reverse.

Further, the self-oscillating module is configured to turn over a square wave of the first winding coil and a square wave of the second winding coil by detecting a current value of the first winding coil, output a modulated square wave of the first winding coil and a modulated square wave of the second winding coil and drive the first winding coil and the second winding coil.

Further, the current superimposing and amplifying module is configured to acquire a current output by the self-oscillating module, counteract excitation currents of the first winding coil and the second winding coil by superimposing the current, and send the current that is not counteracted to the voltage acquisition module.

Further, the voltage acquisition module is configured to receive the current that is not counteracted, the modulated square wave of the first winding coil and the modulated square wave of the second winding coil.

Further, the voltage acquisition module includes a microprocessing unit, the microprocessing unit detecting a rising edge and a falling edge of the modulated square wave of the first winding coil or the modulated square wave of the second winding coil of the self-oscillating module, extracting non-spike signals delayed according to a preset delay time in a plurality of periods of the current that is not counteracted, and performing average output.

Further, the first iron core and the second iron core are strip-shaped.

Further, the first winding coil and the second winding coil are respectively three-dimensional coils.

The invention at least has the beneficial effects that (1) The measured magnetic field is measured as the double iron cores counteract exciting noises and an unsaturated coil current is extracted, so that the complex processing circuit is omitted, and the circuit is easily integrated with a sensitive detection unit, so that the circuit is easily miniaturized;

(2) The self-oscillating module and the double-iron core assembly are interacted to generate a modulation signal to drive the double-iron core assembly, the excitation field directions of the two iron cores are reverse, most of the excitation currents of the two coils are counteracted via the current superimposing and amplifying module when the measured magnetic field is not zero, and a current signal related to the measured magnetic field and a spike current that is not counteracted are left; and current signals at non-spike positions are extracted via the voltage acquisition module, and the measured magnetic field is measured, so that the circuit is easily processed and integrated; and (3) The double iron cores of the double-iron core assembly of the micro-fluxgate sensor are strip-shaped, and the winding coils on the double iron cores are three-dimensional coils. The double iron cores and the winding coils are realized by adopting a standard micro-machining process, so that the size of the fluxgate probe is reduced.

(1) double-iron core assembly; (2) self-oscillating module; (3) current superimposing and amplifying module; (4) voltage acquisition module.

DETAILED DESCRIPTION OF THE INVENTION

Specific embodiments of the invention are described below, and further description on the technical scheme of the invention is made below in combination with the drawings. The invention is not limited to the embodiments.

EXAMPLES

Figure 1:
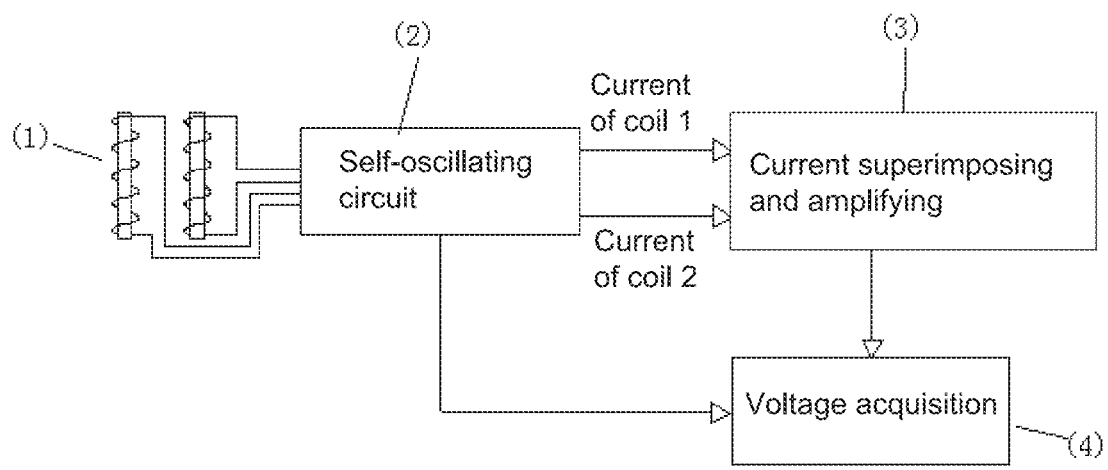
FIG. 1 is a structural block diagram of the micro-fluxgate sensor.
Figure 2:
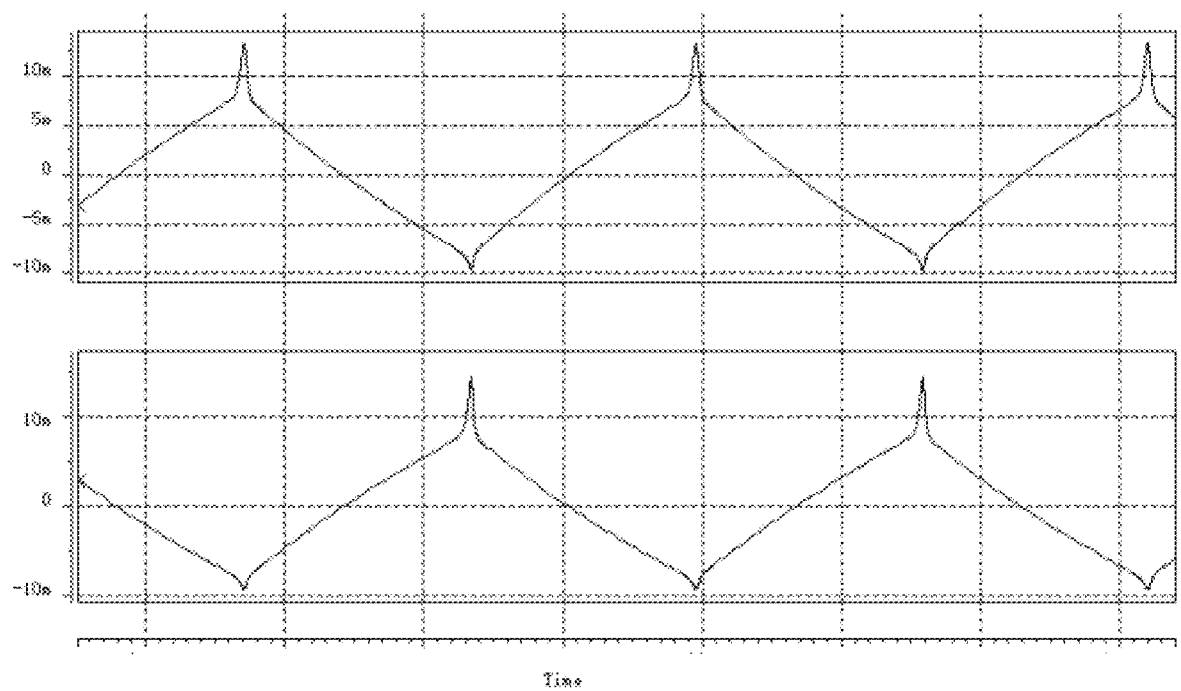
FIG. 2 is a current diagram of currents of a first winding coil and a second winding coil.
Figure 3:
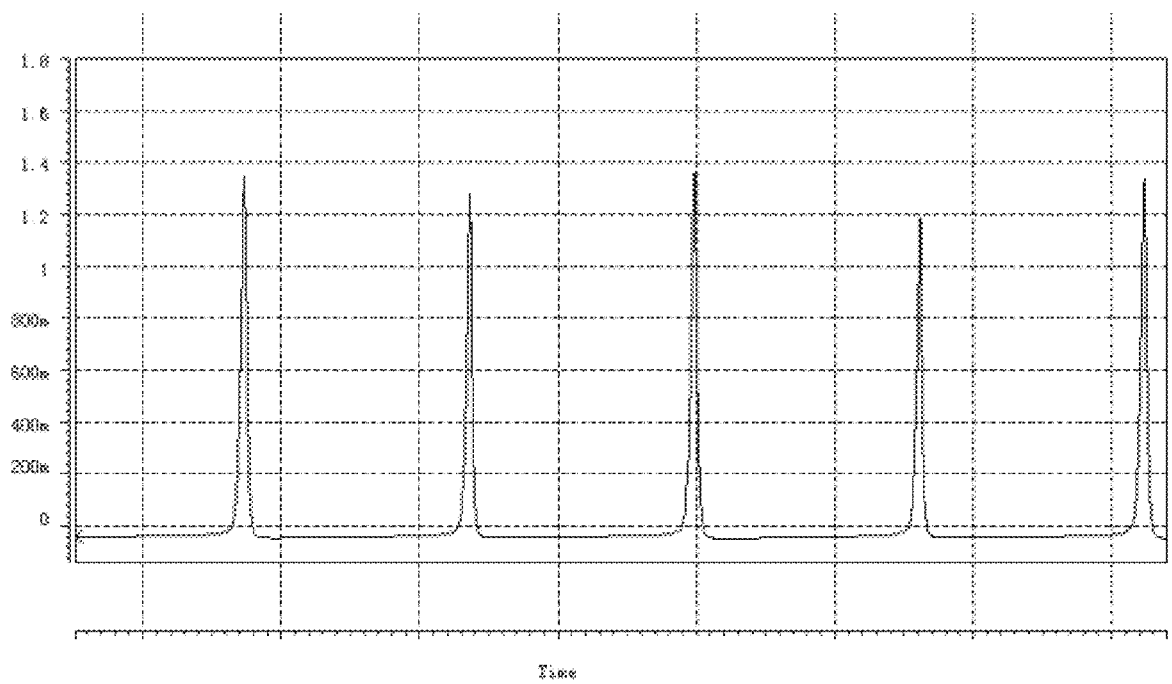
FIG. 3 is a current diagram of superimposed and amplified currents of a first winding coil and a second winding coil.

The embodiment provides a micro-fluxgate sensor. As shown in FIG. 1 to FIG. 3, the micro-fluxgate sensor includes:
a double-iron core assembly, a self-oscillating module, a current superimposing and amplifying module and a voltage acquisition module,
wherein the double-iron core assembly includes a first iron core and a second iron core, the first iron core is provided with a first winding coil, and the second iron core is provided with a second winding coil; the first winding coil and the second winding coil are respectively connected with an input end of the self-oscillating module, and an output end of the self-oscillating module is respectively connected with the current superimposing and amplifying module and the voltage acquisition module.

The self-oscillating module (2) and the double-iron core assembly (1) are interacted to generate a modulated square wave signal to drive the double-iron core assembly (1); the first iron core and the second iron core are strip-shaped; and the first winding coil and the second winding coil are respectively three-dimensional coils. By adopting the double iron cores, the circuit is relatively small in size and is easily integrated.

Field directions generated by the measured magnetic field in the two iron cores are same, and exciting field directions thereof are reverse, that is, an exciting field affects the iron cores reversely and the measured magnetic field affects the iron cores identically.

The self-oscillating module (2) is connected with two winding coils. The exciting field directions of the two iron cores are reverse and directions of the measured field in the two iron cores are same due to a connecting mode between the self-oscillating module and the first winding coil and the second winding coil.

Most of the excitation currents of the two coils are counteracted via the current superimposing and amplifying module (3) when the measured magnetic field is not zero, and a current signal related to the measured magnetic field and a spike current that is not counteracted are left; and current signals at non-spike positions are extracted via the voltage acquisition module (4), and thus, the measured magnetic field is measured.

Further, the self-oscillating module is configured to turn over a square wave of the first winding coil and a square wave of the second winding coil by detecting a current value of the first winding coil, output a modulated square wave of the first winding coil and a modulated square wave of the second winding coil and drive the first winding coil and the second winding coil.

The self-oscillating module (2) turns over the square wave signal by detecting the current of one coil to output a periodical square wave signal so as to drive the winding coil. The self-oscillating module provided by the embodiment can turn over the square waves of the two winding coils by detecting one coil current and drive the two winding coils, herein the square waves of the two winding coils are turned over synchronously.

As shown in FIG. 2, currents of the first winding coil and the second winding coil are provided in the embodiment.

Further, the current superimposing and amplifying module is configured to acquire a current output by the self-oscillating module, counteract excitation currents of the first winding coil and the second winding coil by superimposing the current, and send the current that is not counteracted to the voltage acquisition module. The current that is not counteracted is related to the measured magnetic field and contains information of the measured magnetic field, i.e., a preset measured magnetic field can be measured by measuring the current that is not counteracted.

The superimposed and amplified current that is not counteracted is as shown in FIG. 3, and at the same time, the superimposed current signal generates a direct current offset by the measured magnetic field, and spiking is caused by the exciting signal that is not counteracted completely.

Further, the voltage acquisition module is configured to receive the current that is not counteracted, the modulated square wave of the first winding coil turned over or the modulated square wave of the second winding coil turned over. As the modulated square wave of the first winding coil and the modulated square wave of the second winding coil are synchronous, it is only needed to acquire the modulated square wave of one of the coils.

Further, the voltage acquisition module includes a microprocessing unit, the microprocessing unit detecting a rising edge and a falling edge of the modulated square wave of the first winding coil or the modulated square wave of the second winding coil of the self-oscillating module, extracting non-spike signals delayed according to a preset delay time in a plurality of periods of the current that is not counteracted, and performing average output.

The currents of the first winding coil and the second winding coil are collected via a sampling resistor, herein the sampling resistor is connected with the current superimposing and amplifying module, thereby achieving superimposing and amplifying of the exciting currents of the first winding coil and the second winding coil. The voltage acquisition module detects, through the microprocessing unit, a rising edge and a falling edge of the modulated square wave of the first winding coil or the modulated square wave of the second winding coil output by the self-oscillating module, delays a time according to a preset delay time to avoid spike signals, extracts non-spike signals in a plurality of periods, and performs average output. As shown in FIG. 2 to FIG. 3, the measured magnetic field is modulated to a periodical carrier signal, herein the currents of the first winding coil and the second winding coil are as shown in FIG. 2. The currents that are superimposed and amplified are shown in FIG. 3. The superimposed signal generates a direct current offset by the measured magnetic field, and spiking is caused by the exciting signal that is not counteracted completely. A voltage in the non-spike period is extracted (FIG. 3) by detecting the raising edge of the modulated square wave and delaying the time according to the preset delay time, extracted signals in the plurality of periods are averaged and are then output, so that the measured magnetic field is measured.

The micro-fluxgate sensor is simple in processing circuit and small in occupied space, and is easily integrated. The processing circuit of the micro-fluxgate sensor is easily integrated with the sensitive detection unit on a single chip, the processing circuit is smaller in volume size, low in volume production cost, relatively small in assembly error and better in matching degree of the strip-shaped iron cores and the three-dimensional coils, is not easily affected by temperature, stress and mechanical vibration, is small in output error, and does not need to be calibrated frequently in a later period. The processing circuit of the fluxgate sensor is simplified effectively while the size of the fluxgate probe is reduced greatly.

The specific embodiments described herein are merely illustrations of spirit of the invention. Various modifications or supplements can be made on the described specific embodiments or can be replaced a similar manner by those skilled in the art without deviating from the spirit of the invention or surpassing the scope defined by the attached claims.

What is claimed is:

1. A micro-fluxgate sensor, the micro-fluxgate sensor comprising a double-iron core assembly, a self-oscillating module, a current superimposing and amplifying module and a voltage acquisition module,
   wherein the double-iron core assembly comprises a first iron core and a second iron core, the first iron core is provided with a first winding coil, and the second iron core is provided with a second winding coil; the first winding coil and the second winding coil are respectively connected with an input end of the self-oscillating module, an output end of the self-oscillating module is respectively connected with the current superimposing and amplifying module and the voltage acquisition module, and the current superimposing and amplifying module is connected with the voltage acquisition module.

2. The micro-fluxgate sensor according to claim 1, wherein field directions generated by a measured magnetic field in the first iron core and the second iron core are same, and exciting field directions generated by the first winding coil and the second winding coil in the first iron core and the second iron core are reverse.

3. The micro-fluxgate sensor according to claim 2, wherein the first iron core and the second iron core are strip-shaped.

4. The micro-fluxgate sensor according to claim 2, wherein the first winding coil and the second winding coil are respectively three-dimensional coils.

5. The micro-fluxgate sensor according to claim 1, wherein the self-oscillating module is configured to turn over a square wave of the first winding coil and a square wave of the second winding coil by detecting a current value of the first winding coil, output a modulated square wave of the first winding coil and a modulated square wave of the second winding coil and drive the first winding coil and the second winding coil.

6. The micro-fluxgate sensor according to claim 5, wherein the current superimposing and amplifying module is configured to acquire a current output by the self-oscillating module, counteract excitation currents of the first winding coil and the second winding coil by superimposing the current, and send the current that is not counteracted to the voltage acquisition module.

7. The micro-fluxgate sensor according to claim 6, wherein the voltage acquisition module is configured to receive the current that is not counteracted, the modulated square wave of the first winding coil or the modulated square wave of the second winding coil.

8. The micro-fluxgate sensor according to claim 7, wherein the voltage acquisition module comprises a microprocessing unit, the microprocessing unit detecting a rising edge and a falling edge of the modulated square wave of the first winding coil or the modulated square wave of the second winding coil of the self-oscillating module, extracting non-spike signals delayed according to a preset delay time in a plurality of periods of the current that is not counteracted, and performing average output.

* * * * *